United States Patent
Hsu et al.

(10) Patent No.: US 10,818,804 B2
(45) Date of Patent: Oct. 27, 2020

(54) FLOATING GATE ISOLATION AND METHOD FOR MANUFACTURING THE SAME

(71) Applicant: TAIWAN SEMICONDUCTOR MANUFACTURING CO., LTD., Hsinchu (TW)

(72) Inventors: Shih-Lu Hsu, Tainan (TW); Ping-Pang Hsieh, Tainan (TW); Szu-Hsien Lu, Tainan (TW); Yu-Chu Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/925,551

(22) Filed: Oct. 28, 2015

(65) Prior Publication Data
US 2017/0125602 A1    May 4, 2017

(51) Int. Cl.
| H01L 29/66 | (2006.01) |
| H01L 29/788 | (2006.01) |
| H01L 49/02 | (2006.01) |
| H01L 29/423 | (2006.01) |
| H01L 29/06 | (2006.01) |

(52) U.S. Cl.
CPC .......... H01L 29/7883 (2013.01); H01L 28/00 (2013.01); H01L 29/0653 (2013.01); H01L 29/42324 (2013.01); H01L 29/66825 (2013.01)

(58) Field of Classification Search
CPC ........... H01L 21/76886; H01L 29/7881; H01L 27/115; H01L 27/11521; H01L 29/42324; H01L 27/11519; H01L 29/1083; H01L 29/78; H01L 27/11524; H01L 27/12; H01L 29/40114; H01L 29/78645
USPC ....... 257/316, 319, 325, 321, 314, 758, 510, 257/390; 438/593, 594, 527, 437, 264, 438/261, 201, 692, 238, 259, 267, 258, 438/211, 21, 1
See application file for complete search history.

(56) References Cited

U.S. PATENT DOCUMENTS

| 2007/0001211 A1* | 1/2007 | Lee | H01L 29/40114 257/315 |
| 2007/0023821 A1* | 2/2007 | Kim | H01L 27/115 257/315 |
| 2007/0047304 A1* | 3/2007 | Lee | H01L 27/11521 365/185.05 |
| 2007/0210370 A1* | 9/2007 | Lee | H01L 27/11521 257/315 |
| 2007/0278553 A1* | 12/2007 | Wu | G11C 16/0433 257/314 |
| 2008/0230828 A1* | 9/2008 | Jang | H01L 27/115 257/321 |
| 2009/0212352 A1* | 8/2009 | Aoyama | H01L 21/28273 257/324 |

(Continued)

*Primary Examiner* — Moin M Rahman
(74) *Attorney, Agent, or Firm* — Maschoff Brennan

(57) ABSTRACT

A semiconductor device includes a substrate, a tunneling oxide layer, a floating gate, an isolation layer and a control gate. The tunneling oxide layer is disposed on the substrate. The floating gate is disposed on the tunneling oxide layer. The isolation layer covers a top of the floating gate and peripherally encloses the tunneling oxide layer and the floating gate. The control gate is disposed over a top of the isolation layer.

20 Claims, 10 Drawing Sheets

(56) References Cited

U.S. PATENT DOCUMENTS

| | | | |
|---|---|---|---|
| 2011/0171835 A1* | 7/2011 | Kabe | H01J 37/32192 |
| | | | 438/771 |
| 2013/0105880 A1* | 5/2013 | Kim | H01L 21/28273 |
| | | | 257/316 |
| 2015/0171214 A1* | 6/2015 | Han | H01L 29/4236 |
| | | | 257/330 |
| 2015/0255476 A1* | 9/2015 | Yu | G11C 16/14 |
| | | | 365/185.29 |

* cited by examiner

FLOATING GATE ISOLATION AND METHOD FOR MANUFACTURING THE SAME

BACKGROUND

Memory devices for storing data are typically divided into volatile memory devices and non-volatile memory devices. The volatile memory devices lose the stored data in the absence of power supply. On the other hand, the non-volatile memory devices can keep data stored on them.

There are various types of non-volatile memory devices, such as a read only memory (ROM) and an electrically erasable programmable read only memory (EEPROM). Flash memory is a type of EEPROM. A typical flash memory cell has a control gate and a floating gate formed on a substrate, in which the control gate is disposed over the floating gate and is separated from the floating gate by an isolation layer. The flash memory cell can be electrically charged by injecting electrons from the substrate into the floating gate, and the floating gate is capable of holding charges. The charges can be removed from the floating gate by tunneling the electrons.

Currently, conventional flash memory devices and methods of fabricating flash memory devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
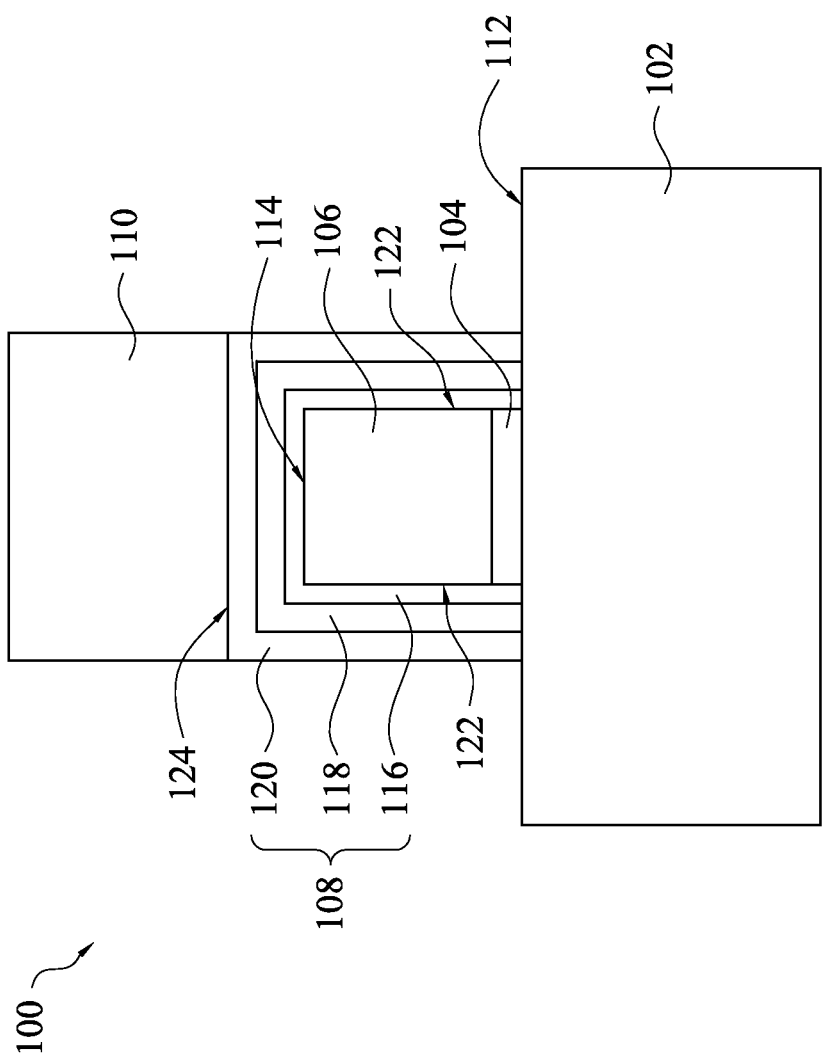
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a flash memory cell, a tunneling oxide material layer and a floating gate material layer are sequentially formed on a semiconductor substrate, and a first portion of the floating gate material layer along an x-axis (as defined in FIG. 2A and FIG. 2B) and a first portion of the tunneling oxide material layer along the x-axis underlying the portion of the floating gate material layer are removed to form a stacked structure. Next, an isolation material layer and a control gate material layer are blanketly formed to cover the stacked structure and the semiconductor substrate in sequence. A portion of the control gate material layer, and a portion of the isolation material layer, a second portion of the floating gate material layer along a y-axis (as defined in FIG. 2A and FIG. 2B) and a second portion of the tunneling oxide material layer along the y-axis, which are underlying the portion of the control gate material layer, are removed to form a gate structure including a tunneling oxide layer, a floating gate, an isolation layer and a control gate sequentially stacked on the semiconductor substrate. Then, a re-oxidization operation is performed on the gate structure to form an oxide layer covering a top of the gate structure and peripherally enclosing the gate structure for sidewall isolation of the floating gate.

In the re-oxidization operation, the isolation layer between the floating gate and the control gate, and the tunneling oxide layer are encroached, and bird's beak structures are formed at outer edges of the isolation layer and the tunneling oxide layer, thus significantly reducing programming and erasing efficiency of the flash memory cell. In addition, the isolation material layer is formed to cover a top and sidewalls of the stacked structure, and in an operation of removing the portion of the control gate material layer, the portion of the isolation material layer, the second portion of the floating gate material layer and the second portion of the tunneling oxide material layer, the second portion of the floating material layer and the isolation material layer on sidewalls of a structure including the portion of the control gate material layer, the second portion of the floating gate material layer and the second portion of the tunneling oxide material layer are not completely removed, and thus a fence which is a remnant of the portion of the isolation material layer and the second portion of the floating material layer is formed. The fence affects the electrical reliability of the flash memory cell, and thus the accuracy of programming and erasing of the flash memory cell is significantly reduced.

Embodiments of the present disclosure are directed to providing a semiconductor device and a method for manufacturing the semiconductor device, in which a tunneling oxide layer and a floating gate are formed, then an isolation layer is formed to cover a top of the floating gate and peripherally enclose the tunneling oxide layer and the floating gate, and a control gate is formed on a top of the isolation layer. A top and sidewalls of the floating gate are isolated by the isolation layer, and the isolation layer may be composed of an ONO (oxide-nitride-oxide) stacked structure, such that the floating gate is effectively isolated, thereby increasing data retention of the semiconductor device. Furthermore, the formation of the isolation layer is completed before a patterning operation of the control gate, and the isolation layer needs not to be removed during the patterning operation of the control gate, such that no fence defect composed of remnants of a portion of the isolation layer desired to be removed during the patterning operation of the control gate is formed, thereby greatly enhancing accuracy of programming and erasing of the semiconductor device. Moreover, the top and the sidewalls of the floating gate are completely isolated by the isolation layer, such that no re-oxidization operation is needed after the formation of the control gate is completed, thereby preventing the tunneling oxide layer and the isolation layer oxide encroachment, thus increasing programming and erasing efficiency of the semiconductor device.

FIG. 1 is a schematic cross-sectional view of a semiconductor device in accordance with various embodiments. A semiconductor device 100 may be a flash memory device. In some embodiments, as shown in FIG. 1, the semiconductor device 100 includes a substrate 102, a tunneling oxide layer 104, a floating gate 106, an isolation layer 108 and a control gate 110. The substrate 102 may be a semiconductor substrate and may be composed of a single-crystalline semiconductor material or a compound semiconductor material. For example, silicon or germanium may be used as a material of the substrate 102. In some exemplary examples, the substrate 102 is composed of silicon.

Referring to FIG. 1 again, the tunneling oxide layer 104 is disposed on a portion of a surface 112 of the substrate 102. The tunneling oxide layer 104 is a thin dielectric layer. In some exemplary examples, the tunneling oxide layer 104 is composed of silicon oxide. The floating gate 106 is disposed on the tunneling oxide layer 104. The floating gate 106 is suitable for storing charges. The floating gate 106 is composed of a conductive material. In some exemplary examples, the floating gate 106 includes a polysilicon layer.

The isolation layer 108 covers a top 114 of the floating gate 106 and peripherally encloses the tunneling oxide layer 104 and the floating gate 106. The isolation layer 108 may include a single layer of a dielectric material. In some examples, the isolation layer 108 includes a multi-layered structure. In some exemplary examples, the isolation layer 108 includes a first oxide layer 116, a nitride layer 118 and a second oxide layer 120 stacked in sequence. Each of the first oxide layer 116 and the second oxide layer 120 may be composed of silicon oxide, and the nitride layer 118 may be composed of silicon nitride. For example, the isolation layer 108 may include an ONO structure for providing a better blocking ability to prevent the chargers stored within the floating gate 106 from escaping.

The top 114 and sidewalls 122 of the floating gate 106 are isolated by the isolation layer 108, and the isolation layer 108 may include an ONO structure, such that the chargers can be effectively held in the floating gate 106, thereby increasing a data retention capability of the floating gate 106.

Referring to FIG. 1 again, the control gate 110 is disposed over a top 124 of the isolation layer 108. The control gate 110 is suitable for tunneling of chargers. The control gate 110 is composed of a conductive material. In some exemplary examples, the control gate 110 includes a polysilicon layer.

The isolation layer 108 covers the top 114 and the sidewalls 122 of the floating gate 106, such that no re-oxidization operation is needed for isolating the sidewalls 122 of the floating gate 106 after the formation of the control gate 110 is completed, thereby preventing the isolation layer 108 and the tunneling oxide layer 104 from being encroached by the re-oxidization operation, thus enhancing programming and erasing efficiency of the semiconductor device 100. Moreover, the formation of the isolation layer 108 is completed before the control gate 110 is formed, such that no fence defect composed of remnants of a portion of the isolation layer 108 which is desired to be removed during the patterning operation of the control gate 110 is formed, thereby greatly enhancing accuracy of programming and erasing of the semiconductor device 100.

Figure 2A:
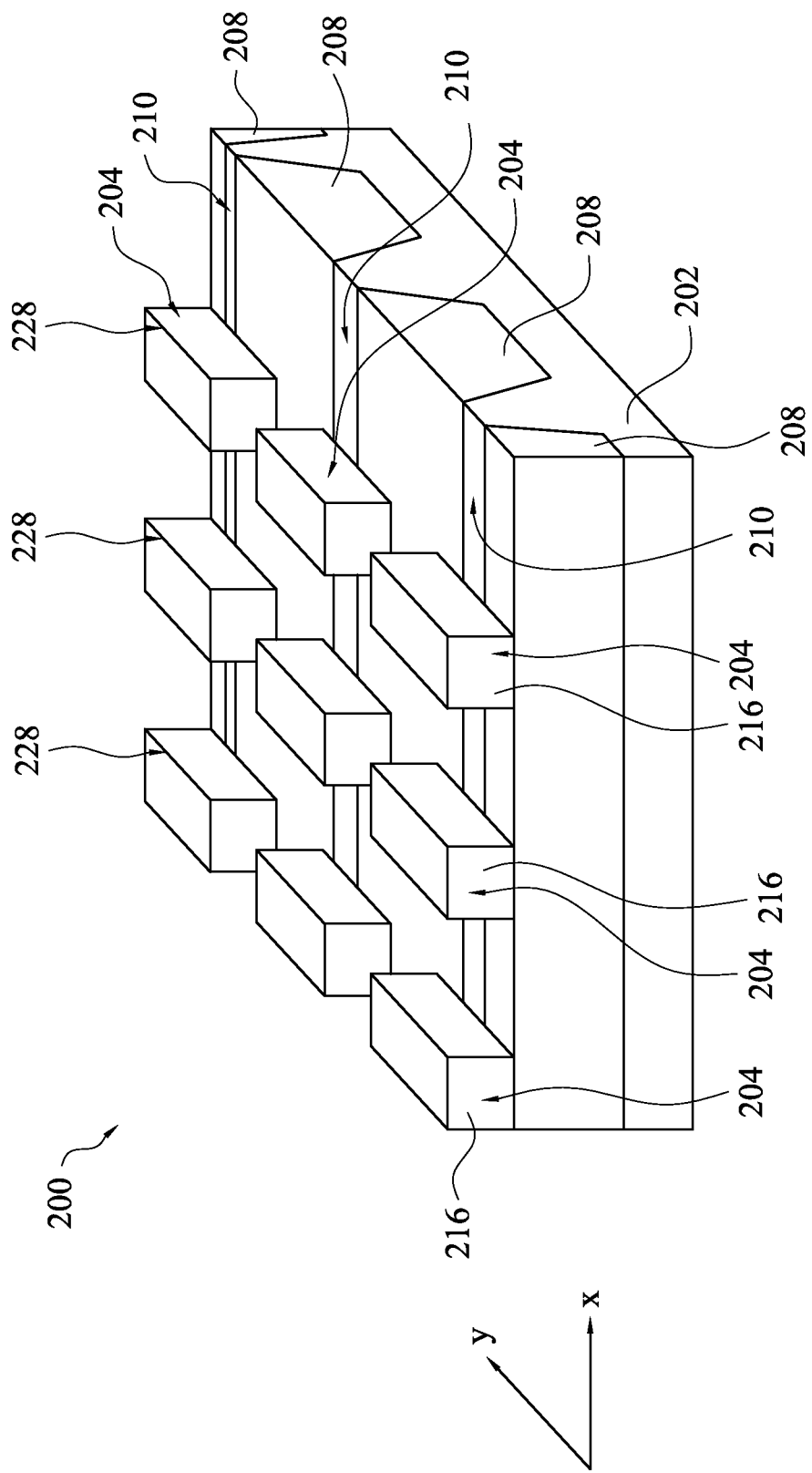
FIG. 2A is a schematic three-dimensional diagram of a semiconductor device in accordance with various embodiments, in which a control gate is omitted for clarity.
Figure 2B:
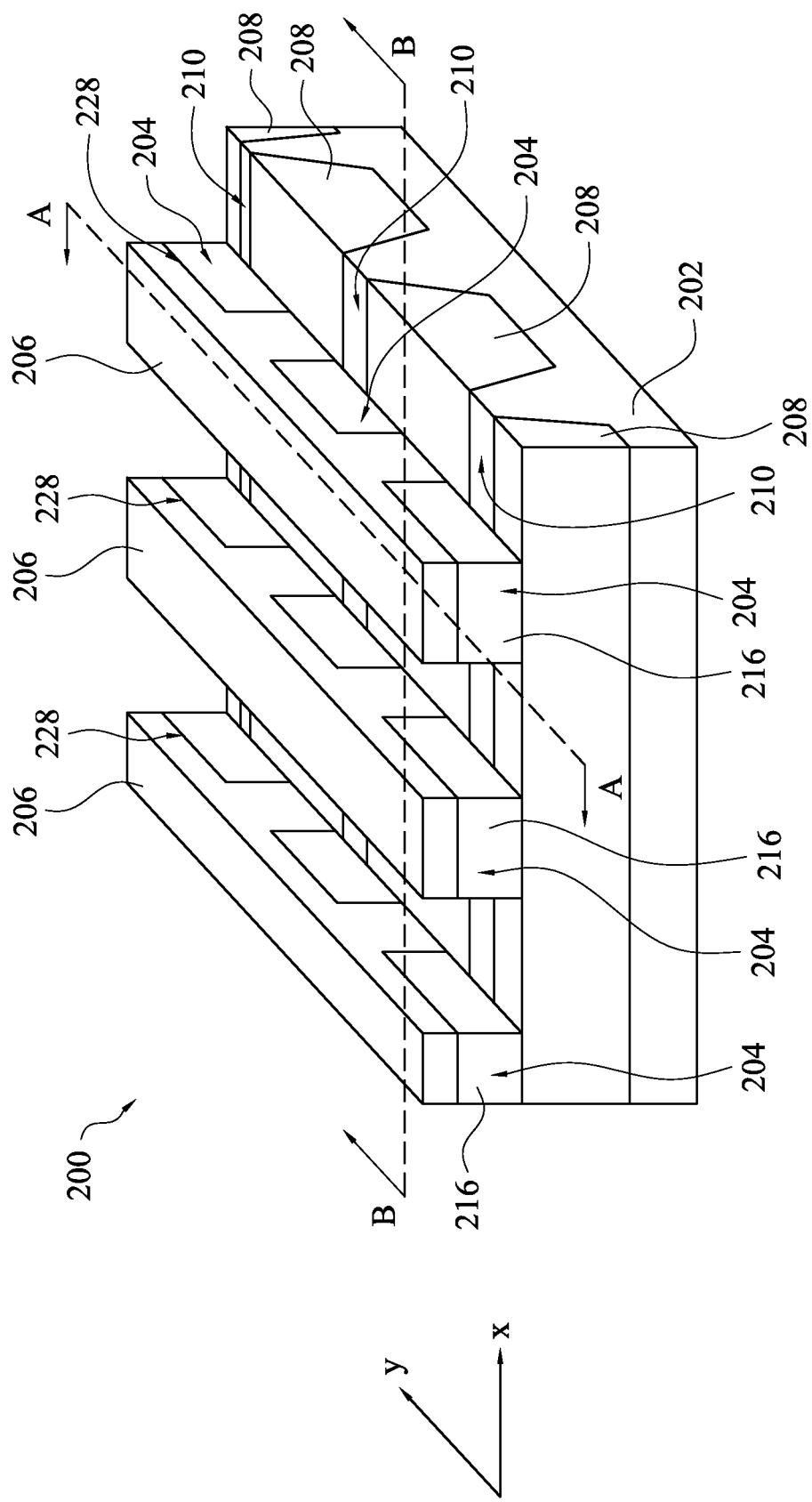
FIG. 2B is a schematic three-dimensional diagram of a semiconductor device in accordance with various embodiments.
Figure 2C:
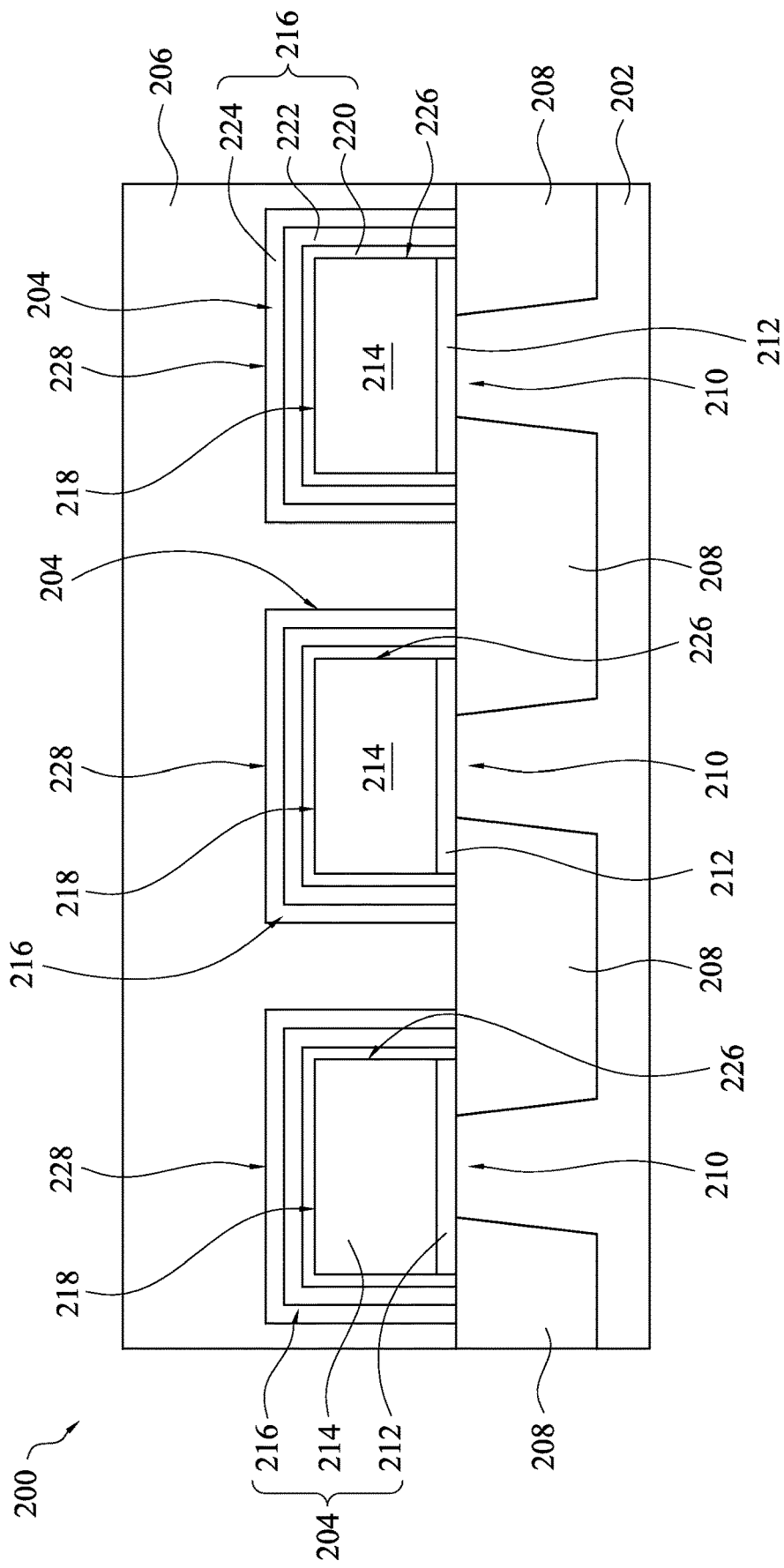
FIG. 2C is a schematic cross-sectional view viewed along a line A-A of the semiconductor device shown in FIG. 2B.
Figure 2D:
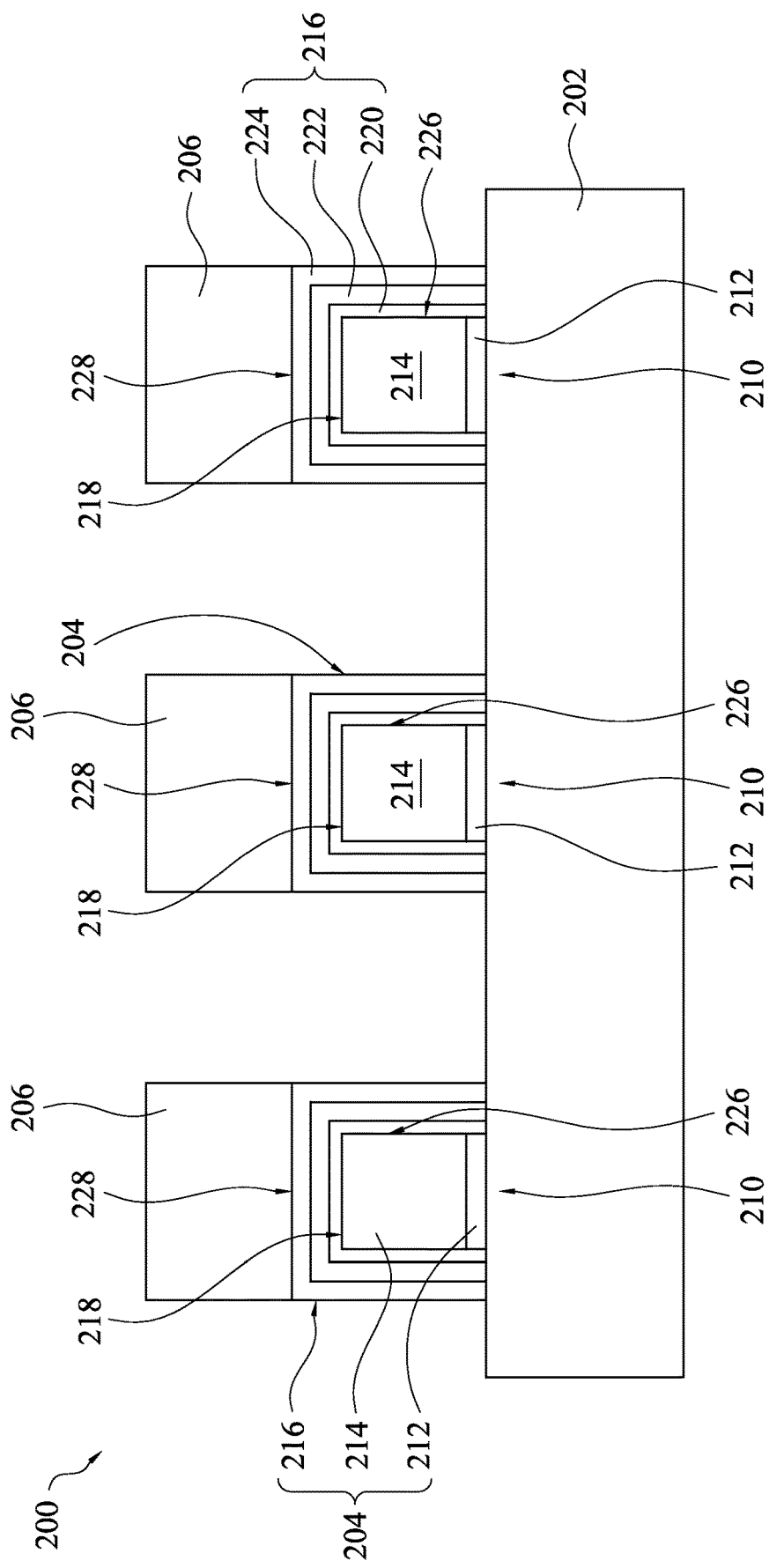
FIG. 2D is a schematic cross-sectional view viewed along a line B-B of the semiconductor device shown in FIG. 2B.

Refer to FIG. 2A through FIG. 2D. FIG. 2A is a schematic three-dimensional diagram of a semiconductor device in accordance with various embodiments, in which a control gate is omitted for clarity. FIG. 2B is a schematic three-dimensional diagram of a semiconductor device in accordance with various embodiments. FIG. 2C is a schematic cross-sectional view viewed along a line A-A of the semiconductor device shown in FIG. 2B. FIG. 2D is a schematic cross-sectional view viewed along a line B-B of the semiconductor device shown in FIG. 2B. In some examples, a semiconductor device 200 includes a substrate 202, at least two gate structures 204 and one control gate 206. In some exemplary examples, as shown in FIG. 2B through FIG. 2D, the semiconductor device 200 includes the substrate 202, various gate structures 204 and various control gates 206.

The substrate 202 may be a semiconductor substrate. The substrate 202 may be composed of a single-crystalline semiconductor material or a compound semiconductor material. For example, silicon or germanium may be used as a material of the substrate 202. In some exemplary examples, the substrate 202 is composed of silicon. As shown in FIG. 2B, one or more isolation structures 208 are disposed in the substrate 202 to define at least two active regions 210 of the substrate 202. The isolation structures 208 extend in the substrate 202 along an x-axis. In some exemplary examples, the isolation structures 208 are parallel to each other. As shown in FIG. 2C, adjacent two of the active regions 210 are isolated by one of the isolation structures 208. In some exemplary examples, each of the isolation structures 208 includes a shallow trench isolation (STI) structure. Each of the isolation structures 208 may include a silicon oxide layer.

The gate structures 204 are respectively disposed on the active regions 210 and a portion of the isolation structures 208. In some examples, as shown in FIG. 2B, the semiconductor device 200 includes various gate structures 204, and each of the active regions 210 has various gate structures 204 disposed thereon. In some examples, each of the gate structures 204 includes a tunnel oxide layer 212, a floating gate 214 and an isolation layer 216. As shown in FIG. 2C, the tunneling oxide layers 212 are respectively disposed on the active regions 210 of the substrate 202 and a portion of the isolation structures 208. Each of the tunneling oxide layers 212 is a thin dielectric layer. In some exemplary examples, each of the tunneling oxide layers 212 is composed of silicon oxide. The floating gates 214 are respectively disposed on the tunneling oxide layers 212. Each of the floating gates 214 is composed of a conductive material. In some exemplary examples, each of the floating gates 214 includes a polysilicon layer.

Referring to FIG. 2C and FIG. 2D again, in each of the gate structures 204, the isolation layer 216 covers a top 218 of the floating gate 214 and peripherally enclosing the tunneling oxide layer 212 and the floating gate 214. The isolation layer 216 may include a single layer of a dielectric material. In some examples, the isolation layer 216 includes a multi-layered structure. In some exemplary examples, the isolation layer 216 includes a first oxide layer 220, a nitride layer 222 and a second oxide layer 224 stacked in sequence. Each of the first oxide layer 220 and the second oxide layer 224 may be composed of silicon oxide, and the nitride layer 222 may be composed of silicon nitride. For example, the isolation layer 216 may include an ONO structure for providing a better blocking ability to prevent the chargers stored within the floating gate 214 from escaping.

In each of the gate structures 204, the top 218 and sidewalls 226 of each of the floating gates 214 are isolated by the isolation layer 216, and the isolation layer 216 may include an ONO structure, such that the chargers can be effectively held in the floating gate 214, thereby increasing a data retention capability of the floating gate 214.

Referring to FIG. 2A and FIG. 2B again, various gate structures 204 are separated form each other and are arranged in several rows, and any adjacent two of the gate structures 204 in one of the rows are separated by one isolation structure 208. The rows are arranged along a y-axis. In one row, one control gate 206 extends on tops 228 of the isolation layers 216 and a portion of the isolation structures 208 between any adjacent two of the gate structures 204 along the y-axis. Each of the control gates 206 is composed of a conductive material. In some exemplary examples, each of the control gates 206 includes a polysilicon layer.

As shown in FIG. 2C and FIG. 2D, in each of the gate structures 204, the isolation layer 216 covers the top 218 and the sidewalls 226 of the floating gate 214, such that no re-oxidization operation is needed for isolating the sidewalls 226 of the floating gate 214 after the formation of the control gate 206 is completed, thereby preventing the isolation layer 216 and the tunneling oxide layer 212 from being encroached during the re-oxidization operation, thus enhancing programming and erasing efficiency of the semiconductor device 200. Moreover, the formation of the isolation layer 216 is completed before the control gate 206 is formed, and the isolation layer 216 needs not to be removed during a patterning operation of the control gate 206, such that no fence defect composed of remnants of a portion of the isolation layer 216 desired to be removed is formed, thereby greatly enhancing accuracy of programming and erasing of the semiconductor device 200.

Figure 3A:
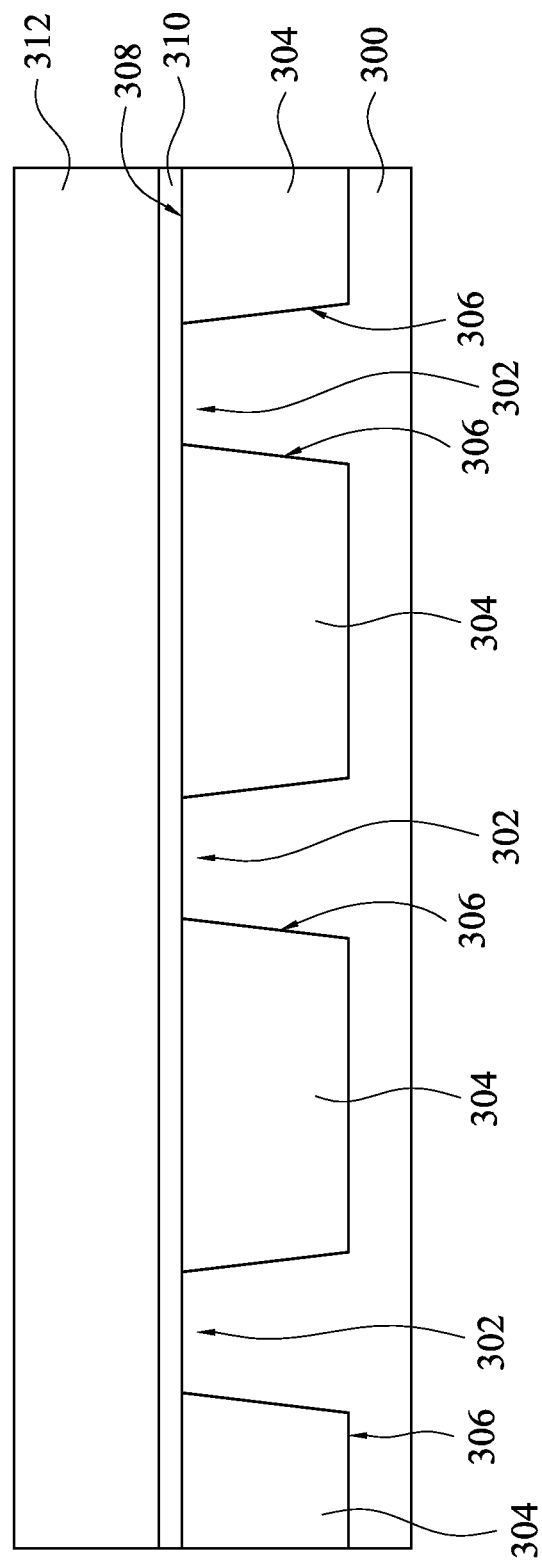
FIG. 3A through FIG. 3D are schematic cross-sectional views of intermediate stages showing a method for manufacturing a semiconductor device in accordance with various embodiments.

FIG. 3A through FIG. 3D are schematic cross-sectional views of intermediate stages showing a method for manufacturing a semiconductor device in accordance with various embodiments. As shown in FIG. 3A, a substrate 300 is provided. The substrate 300 may be a semiconductor substrate and may be composed of a single-crystalline semiconductor material or a compound semiconductor material. In some exemplary examples, silicon or germanium is used as a material of the substrate 300. For example, the substrate 300 may be composed of silicon.

In some examples, the operation of providing the substrate 300 optionally includes providing the substrate 300 having various active regions 302, in which the active regions 302 are defined by at least one isolation structure 304 formed in the substrate 300. For example, as shown in FIG. 3A, four isolation structures 304 are formed in the substrate 300 to define the substrate 300 having three active regions 302, in which adjacent two of the active regions 302 are isolated by one of the isolation structures 304. The isolation structures 304 may extend in the substrate 300 along a direction. In some exemplary examples, the isolation structures 304 are parallel to each other. In some exemplary examples, each of the isolation structures 304 includes a shallow trench isolation structure. For example, in the operation of forming the isolation structures 304, trenches 306 may be formed in the substrate 300, an isolation material layer may be formed on a surface 308 of the substrate 300 and fill the trenches 306, and then an excess portion of the isolation material layer over the surface 308 of the substrate 300 may be removed to form the isolation structures 304 respectively in the trenches 306. In some exemplary examples, the isolation structures 304 are formed using a high-density plasma chemical vapor deposition (HDP CVD) technique. Each of the isolation structures 304 may include a silicon oxide layer.

Figure 3B:
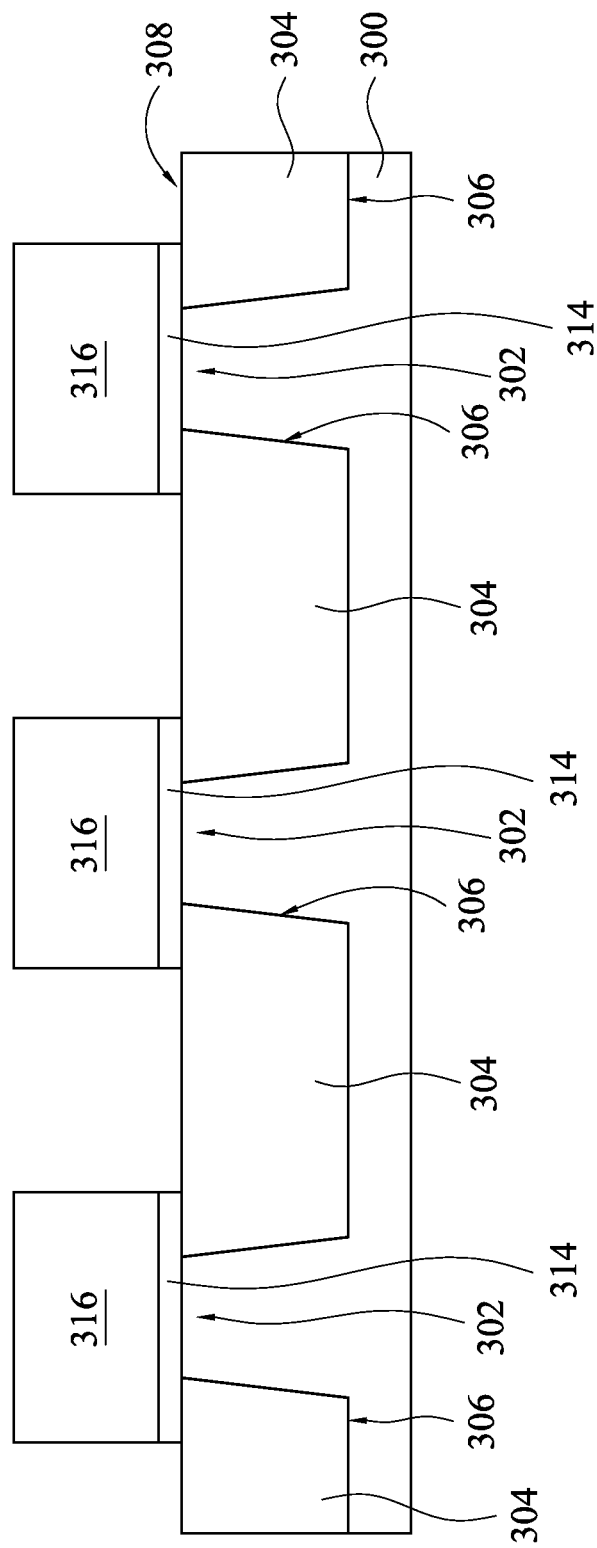

After the operation of providing the substrate 300, as shown in FIG. 3B, one or more tunneling oxide layers 314 and one or more floating gates 316 are formed on the surface 308 of the substrate 300. The tunneling oxide layers 314 are respectively formed on the active regions 302 and a portion of the isolation structures 304, and the floating gates 316 are respectively formed on the tunneling oxide layers 314. In some examples, referring to FIG. 3A again, in the operations of forming the tunneling oxide layers 314 and the floating gates 316, an oxide layer 310 is formed to blanketly cover the surface 308 of the substrate 300. The operation of forming the oxide layer 310 may be performed using a thermal oxidation technique or a deposition technique, such as a chemical vapor deposition technique. The oxide layer 310 is a thin dielectric layer, such as a silicon oxide layer. A conductive layer 312 is formed to blanketly cover the oxide layer 310 using, for example, a deposition technique, such as a chemical vapor deposition technique. In some exemplary examples, the conductive layer 312 is formed from polysilicon. Then, a portion of the conductive layer 312 and a portion of the oxide layer 310 are removed to expose a portion of the surface 308 of the substrate 300 in the active regions 302 and another portion of the isolation structures 304, so as to respectively form the floating gates 316 and the tunneling oxide layers 314. For example, the operation of removing the portion of the conductive layer 312 and the portion of the oxide layer 310 may be performed using a photolithography technique and an etching technique.

As shown in FIG. 3B, the floating gates 316 respectively stack on the tunneling oxide layers 314. Each of the stacked structures composed of the tunneling oxide layer 314 and the floating gate 316 may be an island structure. Similar to the arrangement shown in FIG. 2A and FIG. 2B, the stacked structures are arranged in several rows, and any adjacent two of the stacked structures in one of the rows are separated by one isolation structure 304.

Figure 3C:
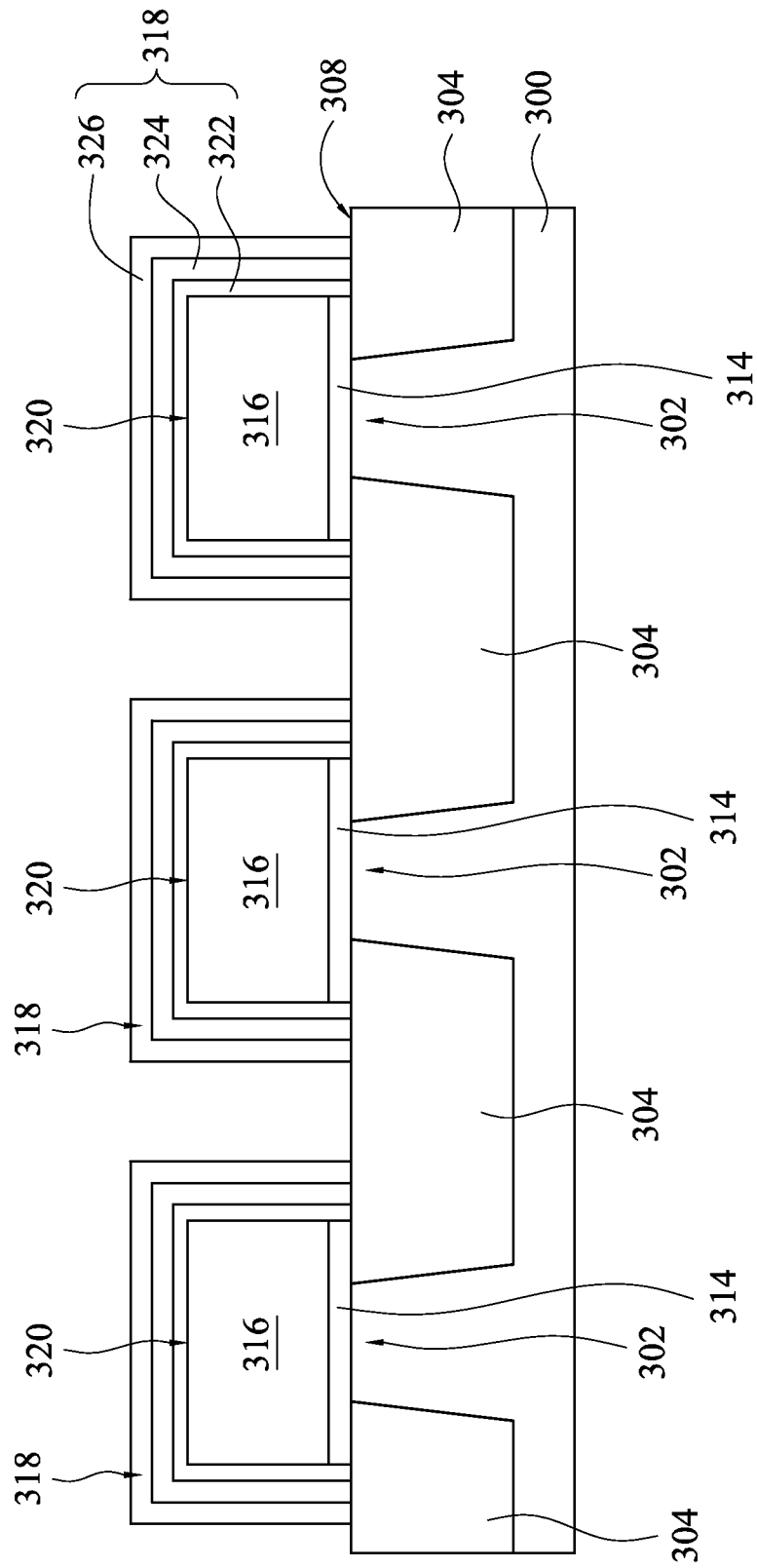

One or more isolation layers 318 are formed. In some examples, as shown in FIG. 3C, various isolation layers 318 are formed to respectively cover tops 320 of the floating gate 316 and peripherally enclose the tunneling oxide layers 314 and the floating gates 316. For example, each of the isolation layers 318 may be formed using a deposition technique, such as a chemical vapor deposition technique. Each of the isolation layers 318 may be formed to include a single layer of a dielectric material. In some examples, the operation of forming the isolation layers 318 includes forming each of the isolation layers 318 including a multi-layered structure. In some exemplary examples, each of the isolation layers 318 is formed to include a first oxide layer 322, a nitride layer 324 and a second oxide layer 326 stacked in sequence. Each of the first oxide layers 322 and the second oxide layers 326 may be formed from silicon oxide, and each of the nitride layers 324 may be formed from silicon nitride. For example, the operation of forming the isolation layers 318 may include forming each of the isolation layers 318 including an ONO structure for providing a better blocking ability to prevent the chargers stored within the floating gates 316 from escaping.

Figure 3D:
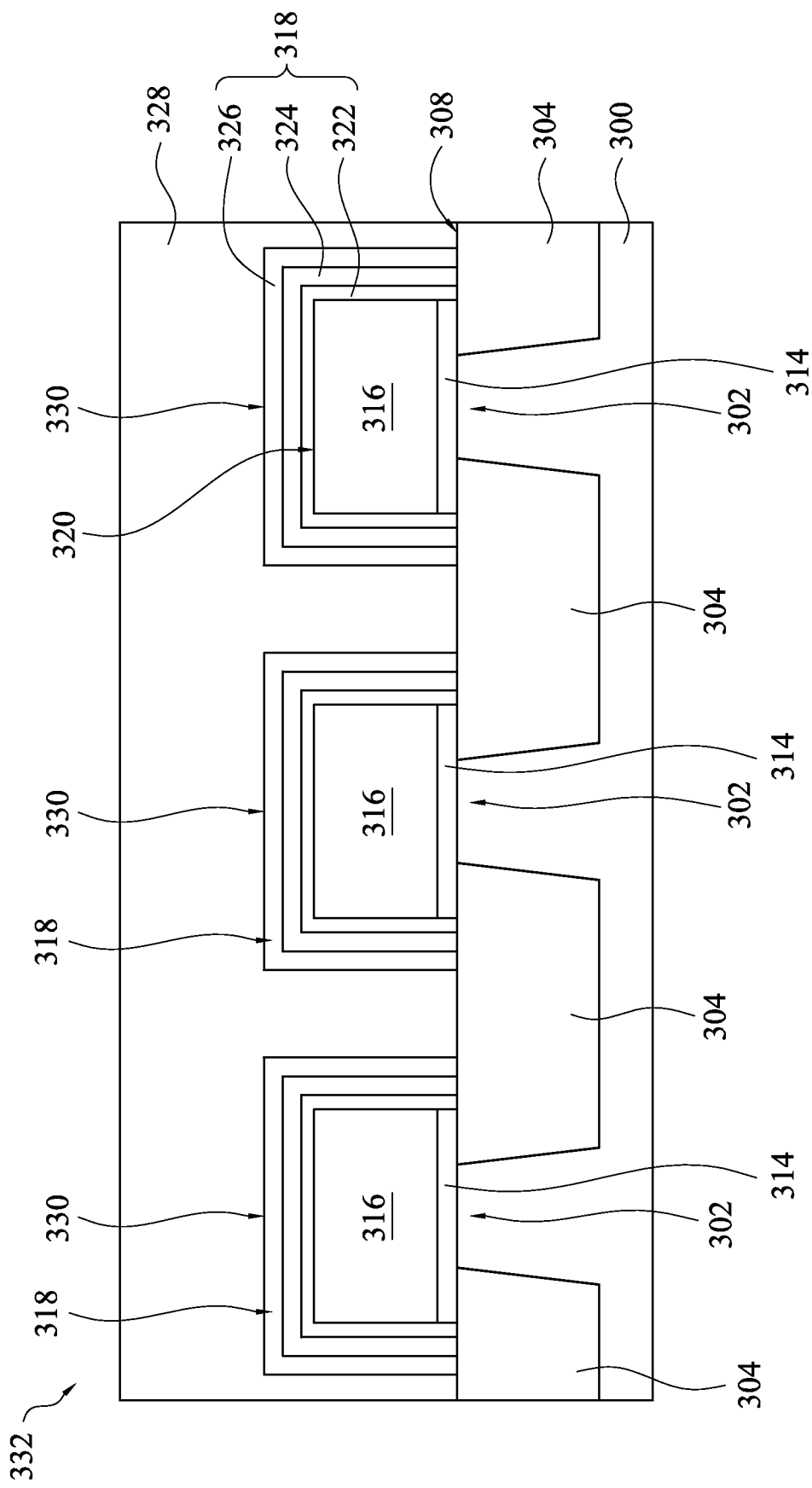

In some examples, only one floating gate 316 is formed, and a control gate 328 is formed over a top 330 of the isolation layer 318 covering the top 320 of the floating gate 316. In various examples, as shown in FIG. 3D, several floating gates 316 are formed and arranged in a row, and a control gate 328 is formed to extend on tops 330 of the isolation layers 318 covering the tops 320 of the floating gates 316 and a portion of the isolation structures 304 between the tunneling oxide layers 314, so as to complete the formation of a semiconductor device 332. In some examples, various floating gates 316 are formed and arranged in several rows similar to the arrangement shown in FIG. 2B, various control gates 328 are formed, and each of the control gates 328 extends on tops 330 of the isolation layers 318 covering the tops 320 of the floating gates 316 in one row and a portion of the isolation structures 304 between the tunneling oxide layers 314 in the row. Each of the control gates 328 is formed from a conductive material. In some exemplary examples, each of the control gates 328 is formed from polysilicon.

In some exemplary examples, in the operation of forming the control gates 328, a conductive layer is blanketly deposited to cover the isolation layers 318, the isolation structures 304 and the surface 308 of the substrate 300. The conductive layer is patterned using a photolithography technique and an etching technique to remove a portion of the conductive layer, so as to form the control gates 328.

The isolation layers 318 cover the tops 320 of the floating gates 316 and peripherally enclose the tunneling oxide layers 314 and the floating gates 316 respectively, no re-oxidization operation is needed for isolating the floating gates 316 after the formation of the control gates 328 is completed, such that the isolation layers 318 and the tunneling oxide layers 314 can be prevented from encroachment during the re-oxidization operation, thereby enhancing programming and erasing efficiency of the semiconductor device 332. In addition, the floating gates 316 are effectively isolated by the isolation layers 318, such that the chargers can be effectively held in the floating gates 316, thereby increasing a data retention capability each of the floating gates 316. Moreover, the formation of the isolation layers 318 is completed before the control gates 328 are formed, and the isolation layers 318 need not to be removed during the patterning operation of the control gates 328, such that no fence defect composed of remnants of a portion of the isolation layers 318 desired to be removed is formed, thereby greatly enhancing accuracy of programming and erasing of the semiconductor device 332.

Figure 4:
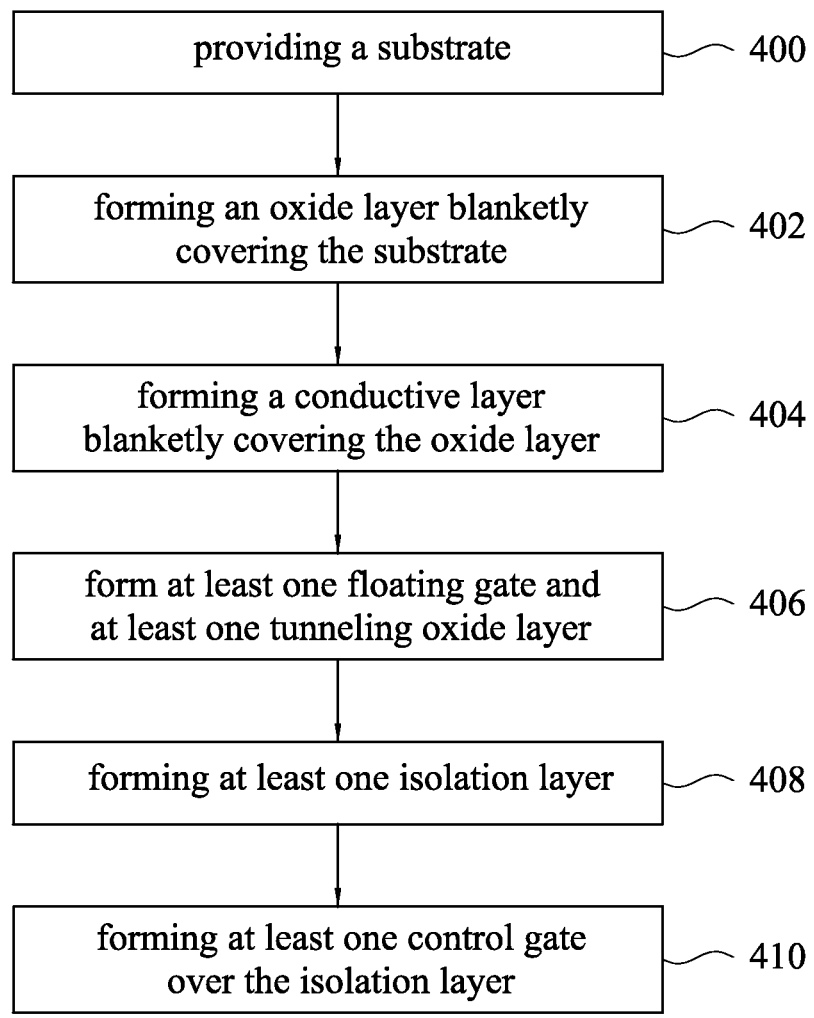
FIG. 4 is a flow chart of a method for manufacturing a semiconductor device in accordance with various embodiments.

Referring to FIG. 4 with FIG. 3A through FIG. 3D, FIG. 4 is a flow chart of a method for manufacturing a semiconductor device in accordance with various embodiments. The method begins at operation 400, where a substrate 300 is provided. The substrate 300 may be a semiconductor substrate, such as a single-crystalline semiconductor substrate or a compound semiconductor substrate. In some exemplary examples, silicon or germanium is used as a material of the substrate 300.

In some examples, the operation of providing the substrate 300 optionally includes providing the substrate 300 having various active regions 302, in which the active regions 302 are defined by at least one isolation structure 304 formed in the substrate 300. For example, as shown in FIG. 3A, four isolation structures 304 are formed in the substrate 300 to define the substrate 300 having three active regions 302, in which adjacent two of the active regions 302 are isolated by one of the isolation structures 304. The isolation structures 304 may extend in the substrate 300 along a direction. The isolation structures 304 may be parallel to each other. In some exemplary examples, each of the isolation structures 304 includes a shallow trench isolation structure. In some exemplary examples, in the operation of forming the isolation structures 304, trenches 306 are formed in the substrate 300, an isolation material layer is formed on a surface 308 of the substrate 300 and fills the trenches 306, and then an excess portion of the isolation material layer over the surface 308 of the substrate 300 is removed to form the isolation structures 304 respectively in the trenches 306. For example, the isolation material layer for the isolation structures 304 may be formed using a HDP CVD technique. Each of isolation structures 304 may be formed from silicon oxide.

At operation 402, as shown in FIG. 3A, an oxide layer 310 is formed to blanketly cover the surface 308 of the substrate 300. The oxide layer 310 may be formed using a thermal oxidation technique or a deposition technique, such as a chemical vapor deposition technique. The oxide layer 310 is formed to include a thin dielectric layer, such as a silicon oxide layer.

At operation 404, as shown in FIG. 3A, a conductive layer 312 is formed to blanketly cover the oxide layer 310 using, for example, a deposition technique, such as a chemical vapor deposition technique. In some exemplary examples, the conductive layer 312 is formed from polysilicon.

At operation 406, as shown in FIG. 3A and FIG. 3B, a portion of the conductive layer 312 and a portion of the oxide layer 310 are removed to expose a portion of the surface 308 of the substrate 300 in the active regions 302 and a portion of the isolation structures 304, so as to respectively form the floating gates 316 and the tunneling oxide layers 314. For example, the operation of removing the portion of the conductive layer 312 and the portion of the oxide layer 310 may be performed using a photolithography technique and an etching technique. As shown in FIG. 3B, the floating gates 316 respectively stack on the tunneling oxide layers 314. Each of the stacked structures composed of the tunneling oxide layer 314 and the floating gate 316 may be an island structure. Similar to the arrangement shown in FIG. 2A and FIG. 2B, the stacked structures are arranged in several rows, and any adjacent two of the stacked structures in one of the rows are separated by one isolation structure 304.

At operation 408, at least one isolation layer 318 is formed. In some examples, as shown in FIG. 3C, various isolation layers 318 are formed to respectively cover tops 320 of the floating gate 316 and peripherally enclosing the tunneling oxide layers 314 and the floating gates 316. For example, each of the isolation layers 318 may be formed using for example, a chemical vapor deposition technique.

Each of the isolation layers 318 may be formed to include a single dielectric layer. In some examples, the operation of forming the isolation layers 318 includes forming each of the isolation layers 318 including a multi-layered structure. In some exemplary examples, each of the isolation layers 318 is formed to include a first oxide layer 322, a nitride layer 324 and a second oxide layer 326 stacked in sequence. Each of the first oxide layers 322 and the second oxide layers 326 may be formed from silicon oxide, and each of the nitride layers 324 may be formed from silicon nitride. For example, each of the isolation layers 318 may be formed to include an ONO structure for providing a better blocking ability to prevent the chargers stored within the floating gates 316 from escaping.

At operation 410, at least one control gate 328 is formed. In some examples, when only one floating gate 316 is formed, one control gate 328 is formed over a top 330 of the isolation layer 318 covering the top 320 of the floating gate 316. In various examples, as shown in FIG. 3D, several floating gates 316 are formed and arranged in a row, and one control gate 328 is formed to extend on tops 330 of the isolation layers 318 covering the tops 320 of the floating gates 316 and a portion of the isolation structures 304 between the tunneling oxide layers 314, so as to complete the formation of a semiconductor device 332. In some examples, similar to the arrangement shown in FIG. 2A and FIG. 2B, various floating gates 316 are formed and arranged in several rows, various control gates 328 are formed, and each of the control gates 328 extends on tops 330 of the isolation layers 318 covering the tops 320 of the floating gates 316 in one row and a portion of the isolation structures 304 between the tunneling oxide layers 314 in the row. Each of the control gates 328 is formed from a conductive material. In some exemplary examples, each of the control gates 328 is formed from polysilicon.

In some exemplary examples, in the operation of forming the control gates 328, a conductive layer is blanketly deposited to cover the isolation layers 318, the isolation structures 304 and the surface 308 of the substrate 300. The conductive layer is patterned using a photolithography technique and an etching technique to remove a portion of the conductive layer, so as to form the control gates 328.

In accordance with an embodiment, the present disclosure discloses a semiconductor device. The semiconductor device includes a substrate, a tunneling oxide layer, a floating gate, an isolation layer and a control gate. The tunneling oxide layer is disposed on the substrate. The floating gate is disposed on the tunneling oxide layer. The isolation layer covers a top of the floating gate and peripherally encloses the tunneling oxide layer and the floating gate. The control gate is disposed over a top of the isolation layer.

In accordance with another embodiment, the present disclosure discloses a semiconductor device. The semiconductor device includes a substrate, at least two gate structures and a control gate. The substrate has at least two active regions defined by at least one isolation structure disposed in the substrate. The gate structures are respectively disposed on the active regions of the substrate. Each of the gate structures includes a tunneling oxide layer, a floating gate and an isolation layer. The tunneling oxide layer is disposed on the active region and a first portion of the at least one isolation structure. The floating gate is disposed on the tunneling oxide layer. The isolation layer covers a top of the floating gate and peripherally encloses the tunneling oxide layer and the floating gate. The control gate extends on the isolation layers and a second portion of the at least one isolation structure between the gate structures.

In accordance with yet another embodiment, the present disclosure discloses a method for manufacturing a semiconductor device. In this method, a substrate is provided. At least one tunneling oxide layer is formed on the substrate. At least one floating gate is formed on the at least one tunneling oxide layer. At least one isolation layer is formed to cover a top of the at least one floating gate and peripherally enclose the at least one tunneling oxide layer and the at least one floating gate. A control gate is formed over a top of the at least one isolation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   providing a substrate having at least one isolation structure;
   forming a pair of tunneling oxide layers on a top surface of the at least one isolation structure;
   forming a pair of floating gates on the tunneling oxide layers, respectively;
   forming a pair of isolation layers covering tops of the floating gates and peripherally enclosing the floating gates, respectively, wherein the isolation layers are spaced apart from each other; and
   forming a control gate over tops of the isolation layers and in direct contact with the isolation structure, wherein widths of the tunneling oxide layers and widths of the floating gates are substantially the same.

2. The method of claim 1, wherein forming the tunneling oxide layers and forming the floating gates comprise:
   forming an oxide layer covering the substrate;
   forming a conductive layer on the oxide layer; and
   removing a portion of the conductive layer and a portion of the oxide layer to respectively form the floating gates and the tunneling oxide layers.

3. The method of claim 1, wherein forming the isolation layers comprises forming the isolation layers comprising a multi-layered structure.

4. The method of claim 1, wherein forming the isolation layers comprises forming the isolation layers comprising an oxide-nitride-oxide (ONO) structure.

5. The method of claim 1, wherein providing the substrate comprises providing the substrate having a plurality of active regions defined by the at least one isolation structure.

6. The method of claim 5, wherein
   forming the tunneling oxide layers is performed to form the tunneling oxide layers respectively on the active regions and a first portion of the at least one isolation structure;
   forming the isolation layers is performed to form the isolation layers respectively covering the floating gates and peripherally enclosing the tunneling oxide layers and the floating gates; and forming the control gate is performed to form the control gate extending on the isolation layers and a second portion of the at least one isolation structure between the tunneling oxide layers.

7. The method of claim 5, wherein the at least one isolation structure comprises a shallow trench isolation structure.

8. A method for manufacturing a semiconductor device, comprising:
providing a substrate having at least one isolation structure;
forming an oxide layer blanketly covering the substrate;
forming a conductive layer blanketly covering the oxide layer;
removing a portion of the oxide layer and a portion of the conductive layer to respectively form at least one tunneling oxide layer on the substrate and at least one floating gate on the at least one tunneling oxide layer and on a top surface of the at least one isolation structure, wherein a width of the at least one floating gate is the same as a width of the at least one tunneling oxide layer;
forming at least one isolation layer covering a top of the at least one floating gate and peripherally enclosing the at least one tunneling oxide layer; and
forming a control gate over a top of the at least one isolation layer and in contact with the isolation structure, wherein forming the control gate is performed after removing the portion of the oxide layer and the portion of the conductive layer.

9. The method of claim 8, wherein forming the at least one floating gate comprises forming the at least one floating gate from polysilicon.

10. The method of claim 8, wherein forming the at least one isolation layer comprises forming the at least one isolation layer comprising an oxide-nitride-oxide structure.

11. The method of claim 8, wherein forming the control gate comprises forming the control gate from polysilicon.

12. A method for manufacturing a semiconductor device, comprising:
providing a substrate, wherein the substrate is provided to have at least two active regions defined by at least one isolation structure disposed in the substrate;
forming at least two gate structures respectively on the active regions, wherein forming each of the gate structures comprises:
forming a tunneling oxide layer on the active region, wherein the tunneling oxide layer has a width greater than a width of a top surface of the active region;
control gate is in direct contact with the isolation layer
forming a floating gate on the tunneling oxide layer; and
forming an isolation layer covering a top of the floating gate and peripherally enclosing the tunneling oxide layer and the floating gate; and
forming a control gate extending on the isolation layers and in direct contact with the at least one isolation structure between the gate structures, wherein no re-oxidation operation is performed on the gate structures to form an oxide layer on the gate structures.

13. The method of claim 12, wherein forming the tunneling oxide layer and the floating gate comprise:
forming an oxide layer blanketly covering the substrate;
forming a conductive layer blanketly covering the oxide layer; and
removing a portion of the conductive layer and a portion of the oxide layer to respectively form the floating gate and the tunneling oxide layer.

14. The method of claim 12, wherein forming the isolation layer comprises forming the isolation layer comprising a multi-layered structure.

15. The method of claim 12, wherein forming the isolation layer comprises forming the isolation layer comprising an oxide-nitride-oxide structure.

16. The method of claim 12, wherein the at least one isolation structure comprises a shallow trench isolation structure.

17. The method of claim 12, wherein forming the control gate comprises:
forming a conductive layer blanketly covering the isolation layers, the at least one isolation structure, and the substrate; and
patterning the conductive layer to remove a portion of the conductive layer.

18. The method of claim 12, wherein forming the isolation layer is such that the isolation layer is in contact with sidewalls of the tunneling oxide layer and the floating gate.

19. The method of claim 1, wherein tunneling oxide layers are in contact with the top surface of the at least one isolation structure.

20. The method of claim 1, wherein the floating gates are spaced apart from the top surface of the at least one isolation structure.

* * * * *